(12) United States Patent
Mimura et al.

(10) Patent No.: US 6,336,304 B1
(45) Date of Patent: Jan. 8, 2002

(54) HORIZONTAL-ROOFING ROOF AND MOUNTING METHOD THEREOF

(75) Inventors: Toshihiko Mimura; Kimitoshi Fukae; Akiharu Takabayashi, all of Nara; Masahiro Mori, Soraku-gun; Takashi Ohtsuka, Kyotanabe, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/640,751

(22) Filed: Aug. 18, 2000

Related U.S. Application Data

(62) Division of application No. 08/915,666, filed on Aug. 21, 1997, now Pat. No. 6,155,006.

(30) Foreign Application Priority Data

Aug. 30, 1996 (JP) .............................................. 8-246881

(51) Int. Cl.[7] .......................... E04D 13/18; E04D 3/362; H01L 31/048
(52) U.S. Cl. ...................... 52/748.1; 52/173.3; 52/533; 136/244; 136/251
(58) Field of Search ............................... 52/173.3, 533, 52/745.06, 747.1, 748.1; 136/251, 259, 244

(56) References Cited

U.S. PATENT DOCUMENTS

| 237,133 A | 2/1881 | Sagendorph |
| 302,113 A | 7/1884 | Dellmon |
| 1,669,690 A | 5/1928 | Brandl |
| 3,594,028 A | 7/1971 | Scott |
| 3,945,166 A | 3/1976 | Hosoda et al. |
| 3,958,387 A | 5/1976 | Kandabashi |
| 4,122,643 A | 10/1978 | Hafner |
| 4,133,161 A | 1/1979 | Lester |
| 4,187,661 A | 2/1980 | Poiry |
| 4,189,881 A | 2/1980 | Hawley |
| 4,271,652 A | 6/1981 | Svensson |
| 4,336,413 A | * 6/1982 | Tourneaux .................. 136/251 |
| 4,353,161 A | 10/1982 | Turner |
| 4,424,655 A | 1/1984 | Trostle |
| 4,432,181 A | 2/1984 | Funaki |
| 4,433,200 A | 2/1984 | Jester et al. |
| 4,636,577 A | 1/1987 | Peterpaul |
| 5,092,939 A | 3/1992 | Nath et al. |
| 5,164,020 A | 11/1992 | Wagner et al. |
| 5,409,549 A | 4/1995 | Mori |
| 5,480,494 A | 1/1996 | Inoue |
| 5,571,338 A | 11/1996 | Kadonome et al. |
| 5,589,006 A | 12/1996 | Itoyama et al. |
| 5,651,837 A | 7/1997 | Ohtsuka et al. |
| 6,072,115 A | * 6/2000 | Inoue et al. ............. 136/251 X |
| 6,128,868 A | * 10/2000 | Ohtsuka et al. ............. 52/173.3 |
| 6,155,006 A | * 12/2000 | Mimura et al. ............. 52/173.3 |
| 6,182,403 B1 | * 2/2001 | Mimura et al. ............. 52/173.3 |
| 6,245,987 B1 | * 6/2001 | Shiomi et al. ............... 136/244 |

FOREIGN PATENT DOCUMENTS

| CH | 384837 | 2/1965 |
| DE | 2160623 | 6/1973 |
| DE | 9312518.6 | 11/1993 |
| EP | 0 599 497 | 6/1994 |
| EP | 0 768 721 | 4/1997 |
| GB | 896611 | 5/1962 |
| JP | 59-152670 | 8/1984 |
| JP | 61-287278 | 12/1986 |
| JP | 2-125050 | 5/1990 |
| JP | 2-248563 | 10/1990 |

(List continued on next page.)

*Primary Examiner*—Laura A. Callo
(74) *Attorney, Agent, or Firm*—Fitzpatrick, Cella, Harper & Scinto

(57) ABSTRACT

A roof in which an upper-end engaging portion of a downstream roof panel is seam-jointed with a lower-end engaging portion of an upstream roof panel, wherein at least the lower-end engaging portion has flexural rigidity enough to disengage the seam joint.

5 Claims, 11 Drawing Sheets

FOREIGN PATENT DOCUMENTS

| | | | | |
|---|---|---|---|---|
| JP | 2-280387 | * 11/1990 | ................ | 136/251 |
| JP | 5-55618 | 3/1993 | | |
| JP | 5-167095 | * 7/1993 | ................ | 136/251 |
| JP | 6-85306 | * 3/1994 | ................ | 136/251 |
| JP | 6-114111 | 4/1994 | | |
| JP | 6-151933 | 5/1994 | | |
| JP | 7-122769 | 5/1995 | | |
| JP | 7-202242 | 8/1995 | | |
| JP | 7-222365 | 8/1995 | | |
| JP | 7-302924 | 11/1995 | | |
| JP | 8-185235 | 7/1996 | | |
| WO | WO 92/09768 | 6/1992 | | |

* cited by examiner

TO DC COMBINER BOX

TO DC COMBINER BOX

HORIZONTAL-ROOFING ROOF AND MOUNTING METHOD THEREOF

This application is a divisional of application Ser. No. 08/915,666, filed on Aug. 21, 1997 now U.S. Pat. No. 6,155,006.

BACKGROUND OF THE INVENTION

1. Field of the Invention

The present invention relates to a horizontal-roofing roof, a joint for a horizontal-roofing roof, and a mounting method of a horizontal-roofing roof and, more particularly, to a roof integrated with a solar battery and a mounting method thereof.

2. Related Background Art

There are mainly two ways for placing a solar battery on a roof: one of them is a method for mounting the solar battery on an existing roof; the other is a method for laying the solar battery itself as a roof.

In the former, the solar battery is installed by use of some frame on the existing roof, and conventional solar battery modules can thus be used as they are. However, the installation cost is high and the appearance is poor. Therefore, the latter method is drawing attention recently.

As for the latter method, a variety of mounting methods of roof are known for long in general, and prior art examples using the solar battery include Japanese Laid-open Patent Application No. 5-55618 (tile roofing), Japanese Laid-open Patent Application No. 59-152670 (horizontal roofing), Japanese Laid-open Patent Application No. 6-114111 (horizontal roofing), National Publication of Translated Version No. 6-503684 (vertical roofing), and so on.

In the conventional horizontal-roofing roofs, however, since roof panels are laid from the eaves to the ridge as being seam-jointed, there is a problem that replacement of some roof panels after mounting is very difficult. For example, when a solar battery module on the eave side is faulty, the faulty module cannot be replaced before the entire roof is removed, thus posing a problem that maintenance is very troublesome. This is also the case in the conventional roofs, but in the case of the integral roof with the solar battery, the problem becomes especially serious, because a failure greatly affects the total system.

In addition, there is a problem that it is not easy to specify roof panels to be replaced in the case of the combination solar battery and roof panels, despite the need for replacement of some roof panels. For example, Japanese Laid-open Patent Application No. 59-152670 discloses electrical connection of horizontal roofing, but it has a problem that once solar battery modules have been laid, it becomes impossible to measure an output of solar battery of each module and that checking works thereof require work amounts substantially equal to total replacement.

Additionally, since line connection works of combination solar battery and roofing materials are normally conducted at the same time as construction of roof, there occasionally occur such troubles that the roof is laid with insufficient line connection works. Therefore, complexity of construction of roof is a problem and any horizontal-roofing roof panel and solar battery combination that can fully solve these problems has never existed heretofore.

SUMMARY OF THE INVENTION

The present invention solved the above problems and provides a horizontal-roofing roof panel, a combination roofing panel and solar battery, a joint for a horizontal-roofing roof, and a mounting method of a horizontal-roofing roof, for realizing partial replacement of roof panel in the event of occurrence of a a failure in the roof panel, especially, in the combination solar battery and roof panel.

Further, the present invention provides means capable of specifying a faulty combination solar battery and roof panel in the event of occurrence of a failure.

In addition, the present invention provides means that can prevent occurrence of troubles such as wiring errors due to complexity of wiring works upon mounting of combination solar battery and roof panels and that allows a worker to easily deal with a wiring error in the event of occurrence thereof.

The present invention solved the problems discussed above by use of the following means.

(1) The roof panel has flexibility and engaging portions thereof are formed in a shape capable of being detached and attached even after mounted.

(2) The joint is comprised of a bottom member, a keep member, and a cover member.

(3) Wiring for connecting each solar battery with another is placed below the bottom member of the joint.

(4) At least the joint member is provided with an opening portion for allowing the wiring to be drawn out therethrough.

With the horizontal-roofing roof panel according to the present invention after mounted, when the lower-end engaging portion is removed and when the keep members of joint on the both sides are removed, the roof panel becomes fixed only on the upper side, so that the flexible roof panel can be turned up after mounted. As a result, only some retaining clips can be removed even after mounting of roof. Therefore, the invention realizes such special action that the roof panels horizontally roofed become partly replaceable even after mounted.

Further, since the joint according to the present invention has the opening portion at least in the bottom member, the output of each solar battery can be checked readily through the opening portion by removing the cover member of joint even after mounting of the roof, whereby a faulty combination solar battery and roof panel can be specified readily.

On the other hand, it is anticipated that wind endurance becomes lower because of the detachable arrangement of the engaging portions, but the wind endurance was maintained sufficient successfully by adding a fastener to the engaging portion and changing the shape of the engaging portion.

In general, special care must be taken on flashing in use of the fastener accompanied by penetration of a bolt or the like. Thus, the engaging portions of the roof panel are formed in double wall structure against the sheathing roof board, whereby water going through gaps of a screw can be returned to the lower roof panel, thus maintaining the flashing equivalent to that heretofore.

The fastener according to the present invention further has a merit of preventing rain or the like from directly hitting the fastener, because the roof panels are fastened at an opening portion deep inside of the interconnecting portion of roof. Therefore, the invention has the function to overcome a problem that screws are drawn out by snow in the areas of high snowfall, for example.

With the horizontal-roofing roof panel according to the present invention, it becomes possible to turn up an intermediate portion of the horizontal-roofing roof and thus to perform the electric wiring work easily for the solar battery of each section with access to the terminal portion on the back side of the roof panel. Therefore, even if there is a connection error upon mounting of the roof, the wiring can be rearranged thereafter.

Since the horizontal-roofing roof panel according to the present invention permits the intermediate portion of roof panel to be turned up, the terminal portion on the back side of the roof panel or the like can be checked readily even after mounting of the roof, and it is also possible to repair the terminal portion or the like as well as the wiring at the working site.

DESCRIPTION OF THE PREFERRED EMBODIMENTS

Figure 1:
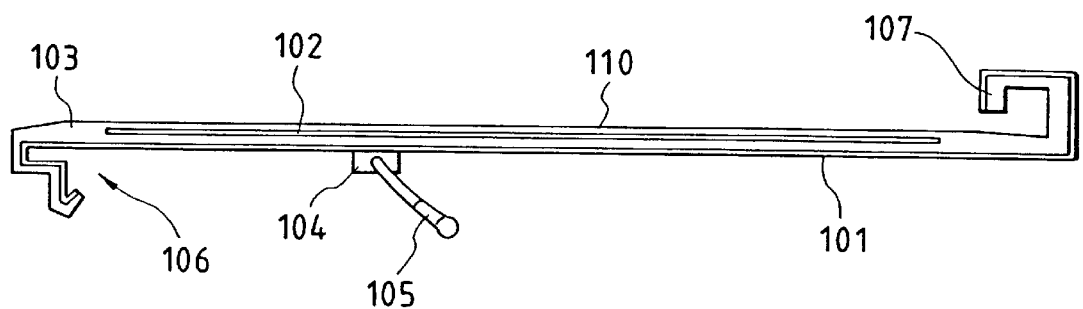
FIG. 1 is a cross-sectional view of a horizontal-roofing roof panel according to the present invention.

FIG. 1 shows a typical example of the horizontal-roofing roof panel in the present invention, which is composed mainly of backing 101, solar battery element 102, sealing material 103, junction box 104, and wire member 105. Numeral 106 designates a lower-end engaging portion of a roof panel located upstream and 107 an upper-end engaging portion of a roof panel located downstream.

Figure 2:
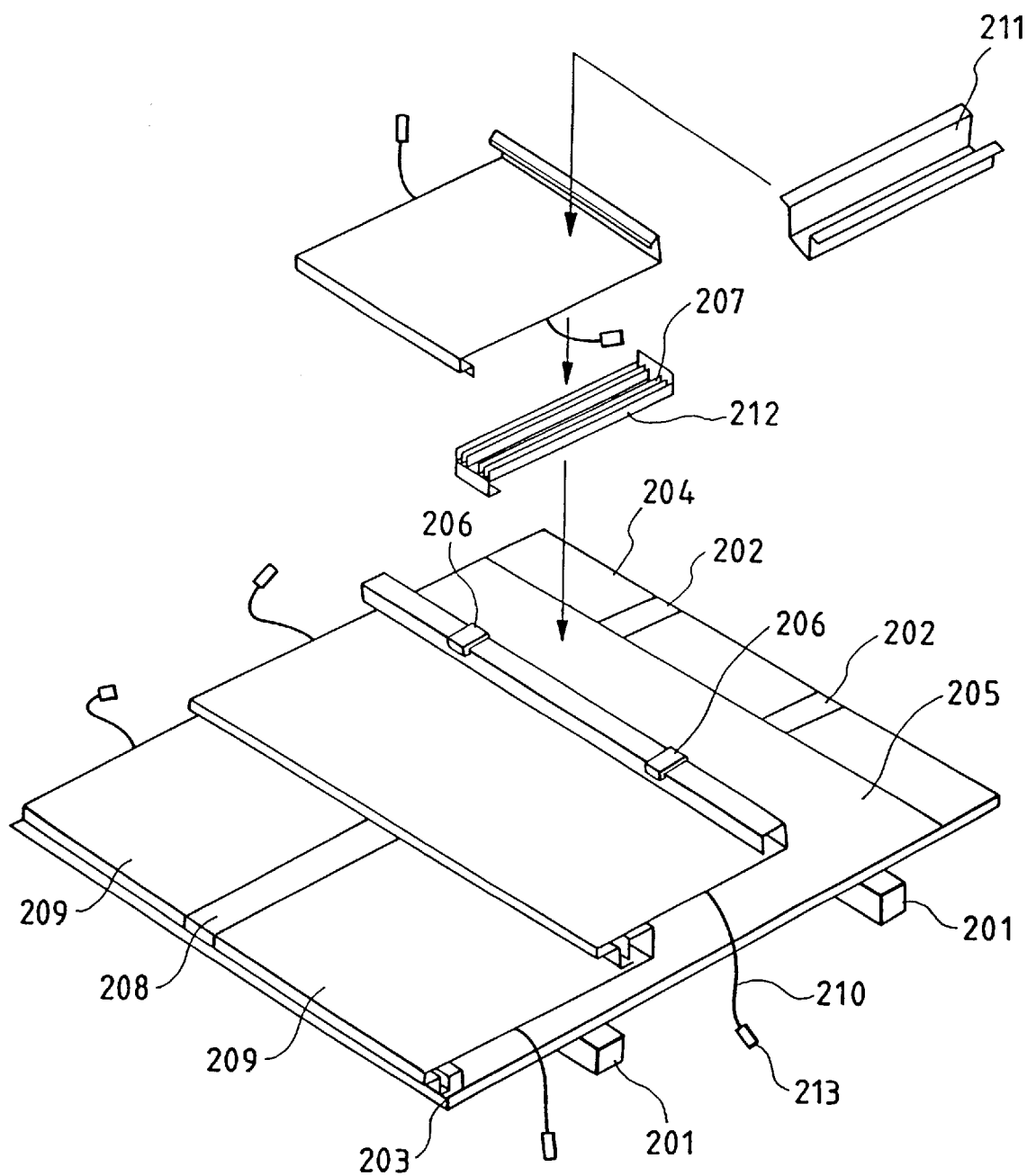
FIG. 2 is a drawing to illustrate a mounting method of a horizontal-roofing roof according to the present invention.

FIG. 2 shows a mounting example of the combination solar battery and roof in the present embodiment, wherein reference numeral 201 designates structural members of purlins, 202 rafters, 203 an eave arabesque, 204 sheathing roof boards which are a roof bed material, 205 an asphalt roofing, 206 retaining clips, 207 a drip plate which is a joint bottom member, 208 a joint cover which is a joint cover member, 209 roof panels, 210 a wiring member, 211 a keep plate which is a joint keep member, and 212 an opening portion.

Mounting Procedures

Mounting procedures of the entire horizontal-roofing roof of the present embodiment will be described in order with reference to FIG. 2.

(1) Rafters 202 are attached to purlins 201.

(2) Eave arabesque 203 as a fastener at the eaves is mounted at the edge of eaves.

(3) Sheathing roof boards 204 are fixed between (on) the rafters 202.

(4) A waterproof sheet as called asphalt roofing 205 is laid over the sheathing roof boards.

(5) The main body of each roof panel 209 is set so that the lower-end engaging portion of roof panel 209 is fit in a stopper of the arabesque and that the upper-end engaging portion is fixed on the rafter 202 by use of retaining clip 206. At this time the wire members 210 are kept out of the roof panel 209.

(6) For horizontal connection between the roof panels, first, the joint drip plate 207 is put into the connecting portion.

(7) The roof panels 209 are connected horizontally, the horizontal wires thereof are connected below the drip plate 207, and the roof panels are fixed to the drip plate 207 by the keep plate 211.

(8) After that, the joint cover 208 is inserted, thus completing horizontal connection.

(9) As for vertical connection, seam joint of upper and lower roof panels is repeated in the same manner as in (5) described above, thereby successively roofing the roof panels toward the ridge.

In the case of large-scale buildings or the like, it is also possible to roof the roof panels of the present invention directly on the rafters or on beams corresponding to the rafters without provision of sheathing roof boards.

Details of Engaging Portion

Figure 3:
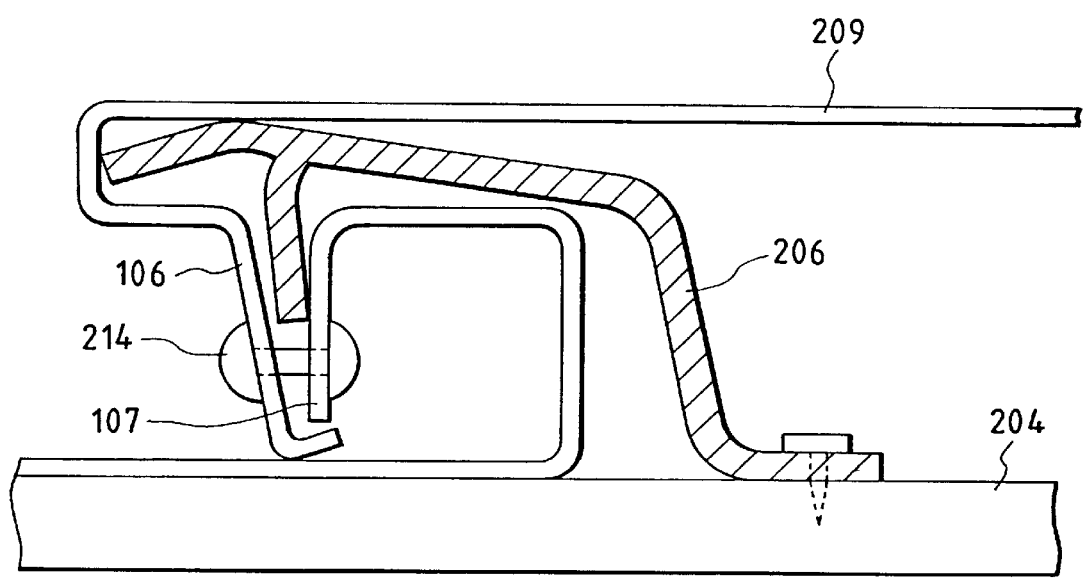
FIG. 3 is a cross-sectional view of a connecting part in the direction of flow of the horizontal-roofing roof according to the present invention.

Details of the engaging portion of the roof panel according to the present invention are shown in FIG. 3. The upper-end engaging portion of the lower roof panel is fixed to the sheathing roof board 204 through the retaining clip 206 by a nail or a drill screw or the like. The retaining clip is shaped as shown in FIG. 3, wherein an inside claw thereof is firmly engaged with a part of the upper-end engaging portion 107 of the lower roof panel. Then the lower-end engaging portion 106 of the upper roof panel is coupled with the upper-end. engaging portion 107 of the lower roof panel and an outside claw of the retaining clip 206 is inserted into a recess of the lower-end engaging portion 106 of the upper roof panel. After that, the upper-end engaging portion of the upper roof panel is also fixed by the retaining clip 206 in the same manner. Then the engaging portions are bored and fastened by a fastener 214. These procedures are repeated. The engaging portions may be preliminarily bored at production facilities.

A specific example of the fastener 214 is a blind rivet, which is used suitably. The blind rivet has sufficient mechanical strength, while it can be broken readily by drill to be removed; and a new rivet can be remounted easily by a dedicated device.

Details of Connecting Part in the Horizontal Direction

Figure 6:
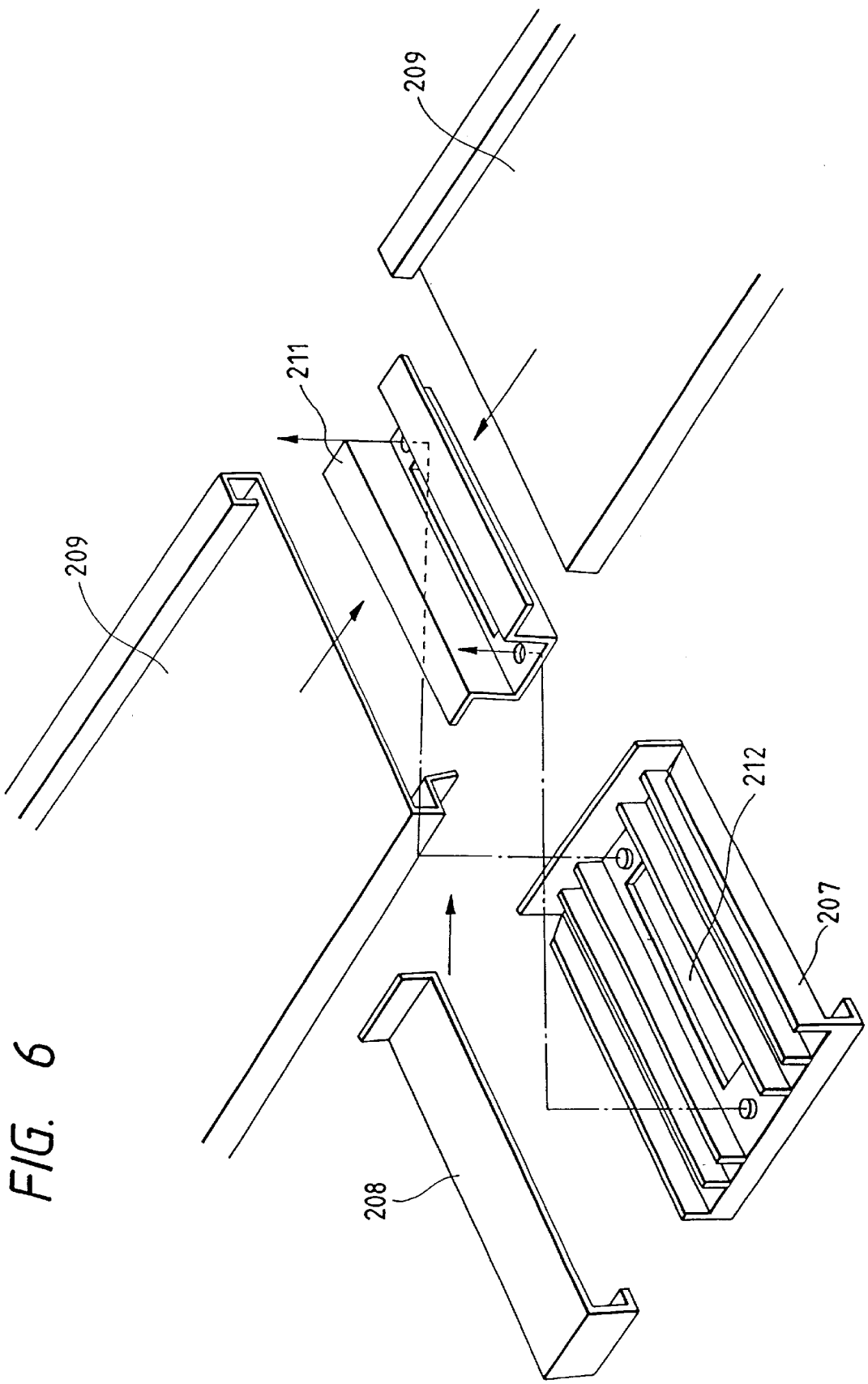
FIG. 6 is a drawing to illustrate mounting of a joint according to the present invention.
Figure 7:
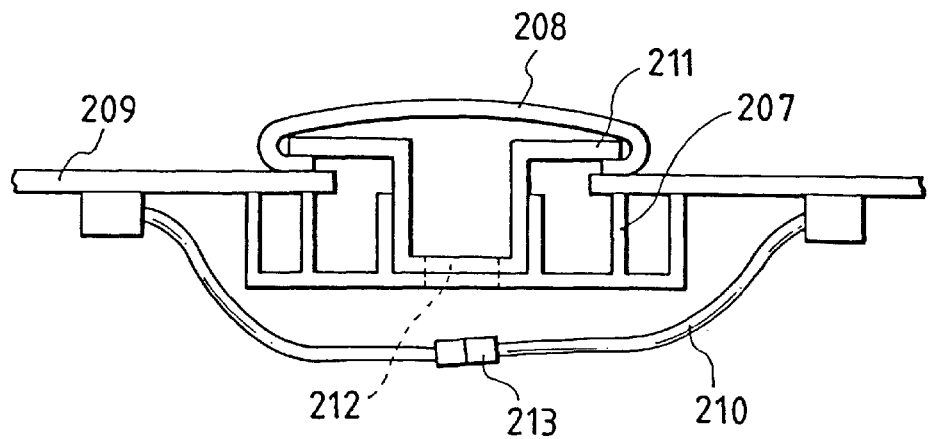
FIG. 7 is a cross-sectional view showing the assembled relation of the roof panel, the joint drip plate, the keep plate and the joint cover after the members of FIG. 6 are assembled.
Figure 8:
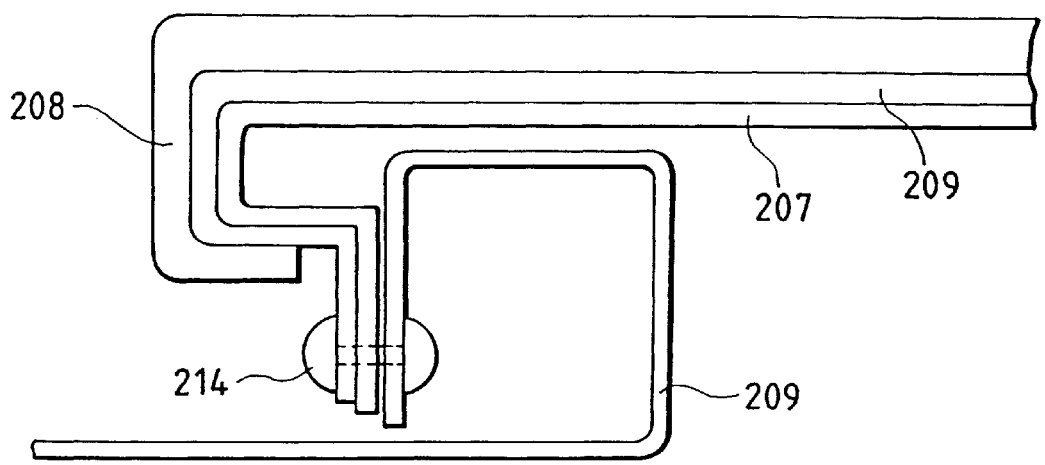
FIG. 8 is a cross-sectional view showing the assembled relation of the roof panel, the joint drip plate and the joint cover after the members of FIG. 6 are assembled.

Details of the connecting part in the horizontal direction of the roof panel according to the present invention are shown in FIG. 6. FIG. 7 is a cross-sectional view showing the assembled relation of the roof panel, the joint drip plate, the keep plate and the joint cover after the members of FIG. 6 are assembled. FIG. 8 is a cross-sectional view showing the assembled relation of the roof panel, the joint drip plate and the joint cover after the members of FIG. 6 are assembled. A joint drip plate 207 is placed below an adjacent area between two adjacent roof panels 209 and functions to guide rainwater flowing into the adjacent area onto the roof panel located downstream. The joint drip plate 207 has a plurality of flange portions of a fin shape for more certain flashing. A keep plate 211 is placed on the joint drip plate 207 and a joint cover 208 is placed so as to cover the keep plate 211. The keep plate 211 and joint drip plate 207 each are provided with an opening portion 212 through which the wire members 210 can be drawn out.

Back Wire

Figure 4:
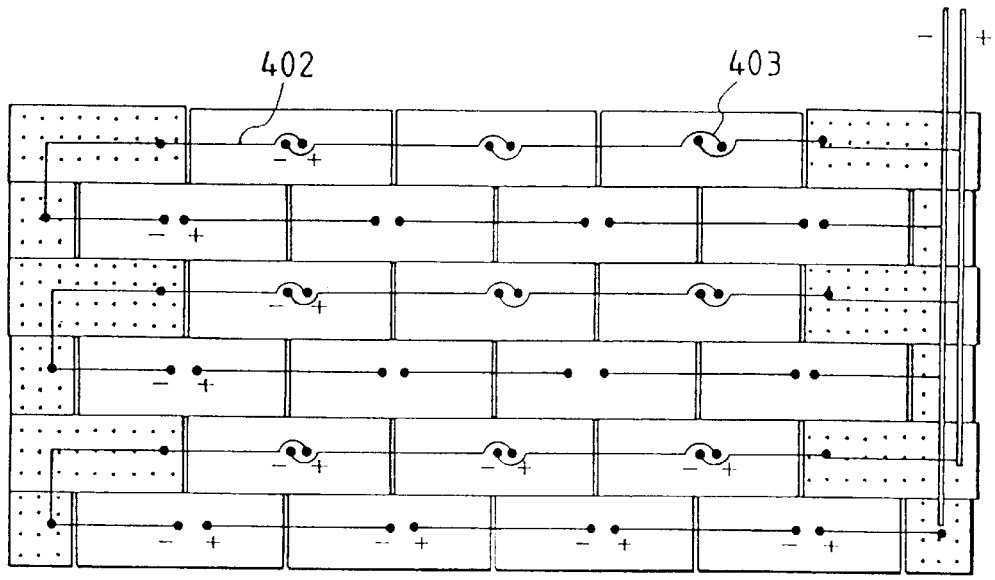
FIG. 4 is a wiring diagram on the back surface of a horizontal-roofing roof incorporating the solar battery according to the present invention.
Figure 20:
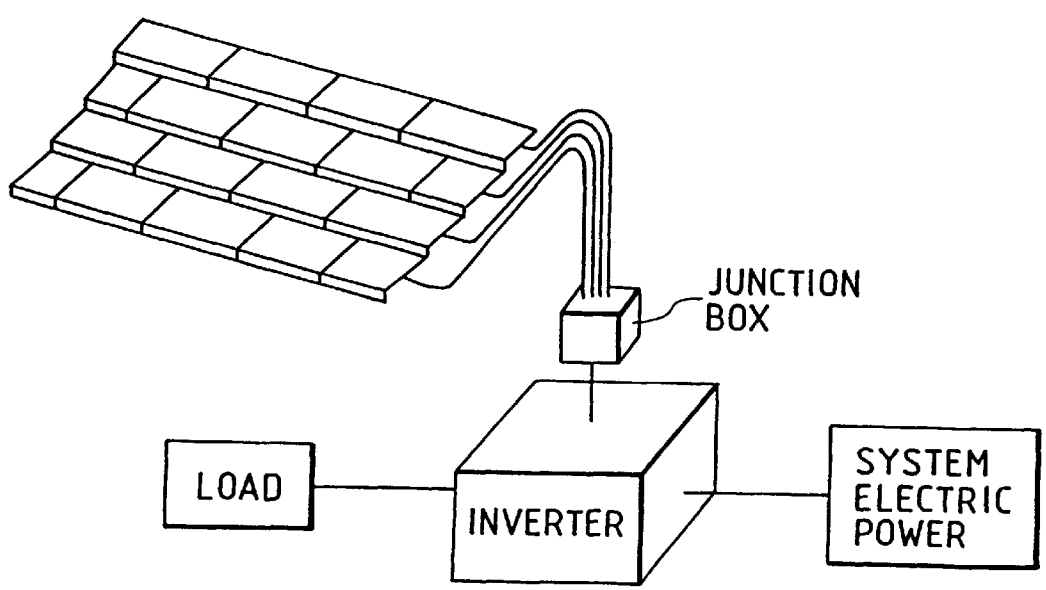
FIG. 20 is a schematic view showing that an output from the roof is supplied into the house through a DC junction box.

FIG. 4 is a drawing to show connection of back wire 402 between the roof panels in the roof according to the present embodiment, wherein the roof panels constitute solar battery strings in each of which adjacent combination solar battery and roof panels are connected in series in order from the positive electrode to the negative electrode or from the negative electrode to the positive electrode. A plurality of solar battery strings are provided, generation voltages thereof are equal, and each voltage is set so as to be an input voltage (for example, 200 V) of inverter. Outputs of the plural solar battery strings are collected independently of each other into a DC combiner box and are connected in parallel therein (FIG. 20). A breaker is provided at a preliminary section before the contact point of the parallel connection of each solar battery string. When a certain solar battery string becomes faulty, the solar battery string can be electrically disconnected to be subjected to maintenance. Hatched members of 401 etc. are roof panels, so called as dummy plates, having no solar battery element. These members are used to supplement incomplete portions produced because of dimensional differences between the dimensions of roof panel and the length of the roof occurring in roofing of roof, and they are also used for works such as gable finish or ridge finish at the edge portions and used as a collecting place of wires from the plural roof panels. In the present embodiment two horizontal strings form a basic unit as to the output of each solar battery, and the output is guided below the dummy plates formed near the edge of roof and then through the ridge or through the eaves to be connected to the DC combiner box inside of the house. As shown in FIG. 20, a power inverter device is connected to the DC combiner box and the power is then supplied to a load inside of the house or to the system electric power.

Figure 5:
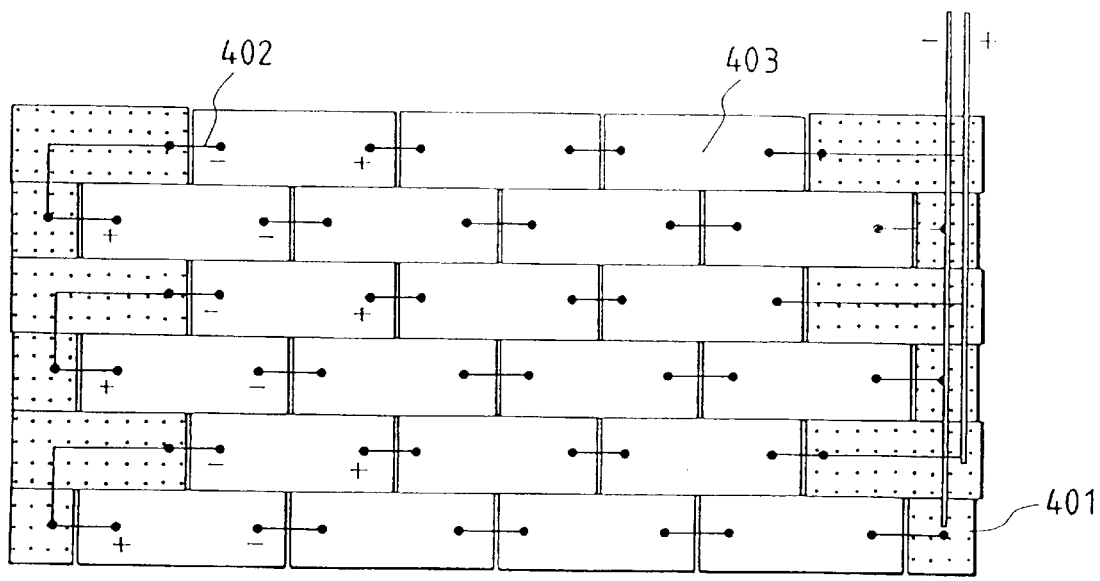
FIG. 5 is a wiring diagram on the back surface of a horizontal-roofing roof incorporating the solar battery according to the present invention.

FIG. 5 shows another installation mode using two types of combination solar battery and horizontal-roofing roof panels the positive electrodes and the negative electrodes of which are arranged symmetric with each other. In the present embodiment, wires can be laid in a simple arrangement and the total length of the wires from the solar battery elements can be decreased, thus achieving effects of reduction in cost of wiring material and reduction in power loss.

Figure 9:
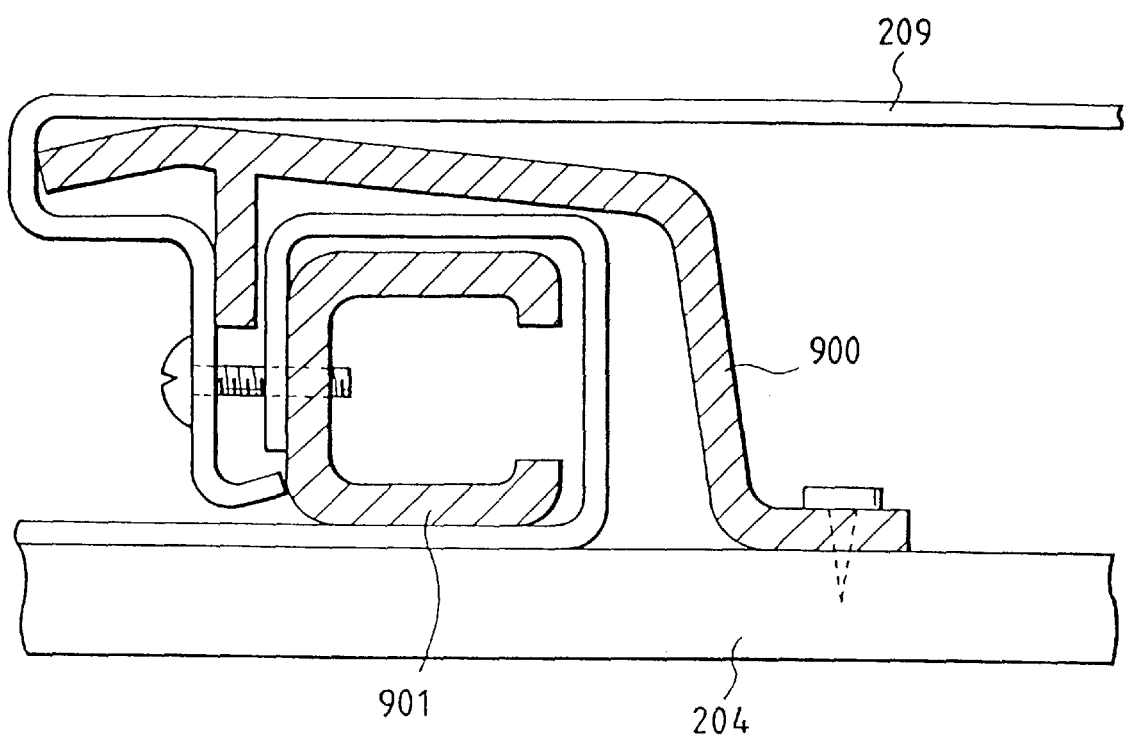
FIG. 9 is a cross-sectional view of a connecting part in the direction of flow of the horizontal-roofing roof according to the present invention.

Since the dummy plates 401 are formed in the same shape as the combination solar battery and roof panels 403, the dummy roof plates, after mounted, can also be turned up, as a matter of course. Therefore, if connection of output of solar battery in the horizontal direction is gathered once in the space below the dummy plate, easiness of inspection will be enhanced further. For use in such applications, an easily removable member such as a bolt is more preferred especially in this part than the blind rivet. FIG. 9 shows a fixing state by use of a bolt in the present invention, in which reference numeral 900 designates a retaining clip and 901 a screw receiving member.

Although not illustrated, an edge treatment of roof can be done readily by well-known gable finish.

Maintenance Method

Next, basic work procedures during maintenance will be described.

(1) An abnormal string of combination solar battery and roof panels can be specified readily by checking each output of the DC combiner box provided inside the house.

(2) Since the joint cover 208 is engaged at the upper end thereof with the lower-end engaging portion of the upper roof panel, it is first taken away to facilitate drawing of wire.

(3) When the joint cover 208 and keep plate 211 are taken away, the opening portion 212 is formed in the joint drip plate 207 and one can see the wires 210 through the opening portion 212. Thus, by pulling the connector 213 for electrical connection out with a J-shaped hook, the output of each solar battery can be checked readily.

(4) When an abnormal combination solar battery and roof panel is specified, the joint keep plates 211 are removed. This unfixes the both sides of the horizontal-roofing roof panel.

(5) Further, the fastener (214 in FIG. 3) is removed from the lower-edge engaging portion of the above-specified horizontal-roofing roof panel, which enables the roof panel to be turned up toward the upper side. At this point the worker can perform the electrical work readily.

(6) If the roof panel itself needs to be replaced, the roof panel located upstream of the pertinent roof panel is turned up in the same way as described, thereby exposing the retaining clip portion. Then the retaining clip can be removed readily and the roof panel can be replaced.

(7) After replacement, a substitute roof panel is fixed in the reverse procedures of (1) to (5), thus completing the maintenance work of the horizontal-roofing roof.

Description of Each Member

Described below are the members constituting the roof panel and the members associated with the mounting of roof panel.

1. Members Constituting the Roof Panel (1-1 Backing)

The backing 101 needs to have such flexural rigidity as to permit the portion forming the lower-end engaging portion 106 to be turned up and then to be brought back into the original state. This flexural rigidity is determined preferably so that human power can turn up the base.

It is known that the relation of $E=fh^3/3x$ holds for the flexural rigidity E, where h is the height of the lower-end engaging portion, x a displacement amount of the lower-end engaging portion, and f is force exerted on the lower-end engaging portion during the turning-up. Experiments of the inventor confirmed that the force f for turning up the seam-jointed roof panel could be up to the force of about 400 kg by use of a jig such as a nail puller. Normally, the height h of the lower-end engaging portion of the horizontal-roofing roof cannot be so high in the sense of the appearance and is determined to be about 5 cm in the roof panel of the present invention. The displacement amount x for disengaging the seam joint needs to be at least 1 cm. Therefore, the flexural rigidity E of the backing is preferably smaller than $1.6 \times 10^4$ kgcm$^2$. However, this value varies up and down slightly depending upon the shape of the lower-end engaging portion.

The material for the backing can be selected from steel sheets, sheets of nonferrous metals, or plastics. Examples of the steel sheets include surface-treated steel sheets, coated steel sheets, alloys or special steels containing another element, and composite steel sheets laminated with a heat-insulating material or the like. In general, the material is selected from hot-dip galvanized steel sheets, galphan, galvalium steel sheets, hot-dip aluminized steel sheets, copper-plated steel sheets, polyvinyl chloride precoated steel plates, fluorocarbon resin steel sheets, stainless steel sheets, high damping steel sheets, heat-insulating galvanized sheet iron, atmosphere corrosion resisting steel, and the aforementioned coated steel sheets; or from the nonferrous metals, such as copper sheets, aluminum alloy sheets, zinc alloy sheets, lead sheets, titanium sheets, and the aforementioned coated color sheets.

(1-2 Solar Battery Element)

There are no specific limitations on the type of the solar battery element 102 used in the present invention, and it may be of any form, either single crystal, polycrystal, fine crystal, or amorphous. The solar battery element may be either of an Si based material or of a compound based material. Among others, the amorphous solar battery element is preferable because of possession of flexibility. Since the amorphous solar battery element recovers its degradation by heat, it is suitable for use on the roof.

Figure 10:
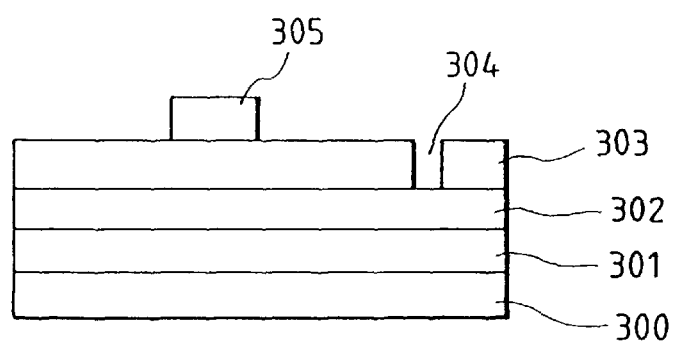
FIG. 10 is an explanatory drawing of a solar battery element.

FIG. 10 shows a cross-sectional view of a non-monocrystal silicon solar battery as an example of the flexible solar battery element.

Substrate 300 is a member for mechanically supporting semiconductor layer 302 in the case of the thin-film solar battery like amorphous silicon and it is also used as an electrode in some cases. The substrate needs to have such heat resistance as to resist heating temperatures upon film formation of the semiconductor layer 302, but may be electrically conductive or insulative.

Specific examples of conductive materials include thin plates of metals such as Fe, Ni, Cr, Al, Mo, Au, Nb, Ta, V, Ti, Pt, and Pb; thin plates alloys thereof, for example, thin plates of brass, stainless steel, or the like; composites thereof; carbon sheets, galvanized steel sheets, and so on.

Specific examples of the electrically insulating materials include films or sheets of heat-resisting synthetic resins such as polyester, polyethylene, polycarbonate, cellulose acetate, polypropylene, polyvinyl chloride, polyvinylidene chloride, polystyrene, polyamide, polyimide, and epoxy; thin plates of composites thereof with glass fiber, carbon fiber, boron fiber, metal fiber, or the like; materials obtained by depositing a metal thin film of different material and/or an insulating thin film of $SiO_2$, $Si_3N_4$, $Al_2O_3$, AlN, or the like on a surface of a thin plate of these metals, a resin sheet, or the like by a surface coating treatment such as a sputtering process, a vapor deposition process, a plating process, or the like; glasses, ceramics, and so on.

Lower electrode (back reflecting layer) 301 is one electrode for extracting power generated in the semiconductor layer 302, which is required to have such a work function as to be an ohmic contact to the semiconductor layer 302. The material for the lower electrode may be selected from the so-called single metals or alloys such as Al, Ag, Pt, Au, Ni, Ti, Mo, W, Fe, V, Cr, Cu, stainless steel, brass, nichrome, $SnO_2$, $In_2O_3$, ZnO, and ITO; transparent conductive oxides (TCO), and so on.

The surface of the lower electrode 301 is preferably smooth, but it may be texturized-where irregular reflection of light is expected. It is also called as a back reflecting layer. When the substrate 300 is electrically conductive, the lower electrode 301 does not have to be provided in particular.

A fabrication process of the lower electrode 301 may employ such a method as plating, vapor deposition, or sputtering, which is selected properly as occasion demands.

The semiconductor layer 302 of the solar battery element is of the semiconductor pin junction.

A semiconductor material for making the i-layer may be selected from the so-called IV-based and IV-alloy-based amorphous semiconductors such as a-Si:H, a-Si:F, a-Si:H:F, a-SiGe:H, a-SiGe:F, a-SiGe:H:F, a-SiC:H, a-SiC:F, and a-SiC:H:F.

A semiconductor material for making the p-layer or the n-layer can be obtained by doping the semiconductor material for making the i-layer described above with a valence electron controller. The raw material of the valence electron controller for obtaining the p-type semiconductor is selected from compounds containing the III element in the periodic table. Examples of the III element include Al, Ga, In, and so on. The valence electron controller for obtaining the n-type semiconductor may be selected from compounds containing the V-element in the periodic table. Examples of the V-element include P, N, As, and S.

A film-forming process of the amorphous silicon semiconductor layer is selected from the well-known methods such as the vapor deposition process, the sputtering process, the RF plasma enhanced CVD process, the microwave plasma enhanced CVD process, the ECR process, the thermal CVD process, and the LPCVD process as occasion demands. The RF plasma enhanced CVD process for decomposing the stock gas by RF plasma and depositing silicon on the substrate is preferably used as an industrially employed process. The RF plasma enhanced CVD has a problem that the decomposition efficiency of stock gas is low, approximately 10%, and a problem that the deposition rate is slow, approximately from 1 Å/sec to 10 Å/sec, and the microwave plasma enhanced CVD process is drawing attention as a film-forming method that can solve such problems.

A reactor for carrying out the above film formation can be selected from well-known devices such as batch type devices or continuous film-forming devices as occasion demands. The so-called tandem cell or triple cell including a laminate of two or more semiconductor junctions can be applied to the solar battery of the present invention in order to increase the spectral sensitivity and the voltage.

Upper electrode (transparent conductive film) 303 is an electrode for extracting electromotive force generated in the semiconductor layer 302, which is paired with the aforementioned lower electrode. The upper electrode needs to be transparent, because it is located on the light incidence side, and it is also called as a transparent conductive film.

The upper electrode 303 desirably has the transmittance of light not less than 85% for efficient absorption of light from the sun, a fluorescent lamp, or the like in the semiconductor layer 302, and further, electrically, it desirably has a sheet resistance value not more than 100 Ω/□ for making electric current generated by light flow horizontally relative to the semiconductor layer 302. Examples of materials having such characteristics include metal oxides such as $SnO_2$, $In_2O_3$, ZnO, CdO, $CdSnO_4$, and ITO ($In_2O_3+SnO_2$).

A fabrication process of the upper electrode 303 is properly selected from the resistance heating vapor deposition process, the electron beam heating vapor deposition process, the sputtering process, the spray process, and so on as occasion demands.

For determining an active area of electric power generation of the above solar battery element, an etching line of 304 can be formed by removing a part of the above transparent conductive film 303 by a desired method selected from the conventionally known etching techniques, for example, such as chemical etching, printing etching, and electrochemical etching.

After that, collector electrode 305 is formed by patterning a metal or a conductive paste by a method of sputtering, vapor deposition, printing, or bonding, or by fixing a metal line onto the transparent conductive film with a conductive paste.

The amorphous solar battery itself, fabricated in this way, has high flexibility and it is a flexible solar battery having the characteristics suitable for the present invention. The location of the solar battery on the roof panel is preferably defined only within the working width in respect of simultaneous processing with the roof panel.

Since the roof panel of the present invention is constructed in the structure capable of being turned up in the direction perpendicular to the longitudinal direction thereof, the longitudinal direction of the collector electrode 305 is desirably determined to be a direction coincident with the longitudinal direction of the horizontal-roofing roof. This can prevent separation of the collector electrode.

(1-3 Sealing Material)

Preferred examples of the sealing material 103 are EVA (ethylene-vinyl acetate), EEA (ethylene-ethylacrylate), PVB (polyvinyl butyral), and so on in terms of the adhesive property with the solar battery element, weatherability, and buffer effect.- For enhancing mechanical characteristics, it is used in some cases together with a filler such as nonwoven glass fabric or silica.

(1-4 Surface Film)

For enhancing the moisture proofness and scratch-resistant property, fluorine based resins are preferably applied for the surface film 110 in respect of weatherability. Examples of the fluorine based resins include polymers of tetrafluoroethylene, TFE (TEFLON or the like available from dupont), copolymers of tetrafluoroethylene with ethylene, ETFE (TEFZEL or the like available from dupont), polyfluorovinyl (TEDLAR or the like available from duPont), polychlorofluoroethylene, CTFE (Neoflon available from Daikin Kogyo), and so on. An ultraviolet absorber well known may be added to these resins so as to improve the weatherability. A more preferred film is a film the surface of which is roughened by a method of corona discharge treatment or the like, in order to improve the adhesive property with the bonding layer. Further, a non-oriented film is more preferable so as to be ready for various types of bending.

(1-5 Sealing Method)

The sealing method includes stacking the backing, the filler, the solar battery element, the filler, and the surface film and then pressing the stack in a vacuum under heat and pressure by a vacuum laminator. After sealing, edges of the backing are bent into the shape of the roof panel.

(1-6 Junction Box)

The junction box 104 is a box for housing the terminal for drawing the power out. The material for the junction box 104 needs to be excellent in the heat resistance, water resistance, electric insulation, and aging property.

In consideration of the above factors, preferred materials for the junction box are plastics and, in consideration of flame retardancy, materials such as flame-retardant plastics and ceramics are preferable.

Examples of the plastics include engineering plastics excellent in the strength, impact resistance, heat resistance, hardness, and aging property such as Noryl, polycarbonate, polyamide, polyacetal, modified PP0, polyester, polyarylate, unsaturated polyester, phenolic resin, and epoxy resin. In addition, thermoplastic resins such as ABS resin, PP, and PVC can also be applied.

The junction box is preferably located as being kept away from water-related portions in terms of the water resistance, electric insulation, and aging property, which does not limit the location thereof at all, and it is preferably located at a position to facilitate finding of wire. Therefore, in the present embodiment the junction box is disposed on the back surface of roof panel and in the central portion, thereby giving special consideration to avoiding entanglement of wire even in the case wherein the terminals of the positive and negative electrodes are wired in the opposite directions.

In order to prevent electric leakage from occurring in case of accidental water leakage, the inside of the junction box is filled with a filler in the present invention. There are no specific limitations on the filler, but preferred kinds of materials for the filler include epoxy resin based adhesives, silicone based potting agents, and silicone based adhesive sealing agents with good electric insulation. The silicone based resins are more preferable in consideration of flexibility or the like. In consideration of workability in addition, preferred materials are those of one-part type with short curing time and those with low viscosity easy to fill even fine parts. In the case of use of silicone one-part type RTV rubber, the curing method is preferably of the deacetonization type or of the dealcoholization type in order to avoid erosion of electrode.

Examples of the epoxy resin based adhesives available from Three Bond Co. Ltd. are trade names "2001," "2002H," "2003," "2016," and "2022," and the above epoxy resins can be used as mixed at a desired ratio with a curing agent selected from trade names "2102," "2103," "2104," "2105F," "2105C," "2106," "2131," "2131D," "2131F," and "2163."

(1-7 Wire Member)

The present invention imparts no specific limitations on the wiring method and a variety of wiring materials and wiring means known conventionally can be applied. Especially, when the wiring structure is given on the back surface of roof panel, the conditions for the water resistance and weatherability can be relaxed, and such structure thus has an advantage of availability of interior wiring materials made of cheap materials. When connectors are used for all connections between the wire materials as in the present embodiment, the wires can be disconnected readily in the event of check, which preferably facilitates checking.

2. Members Associated with Mounting of Roof Panel (2-1 Joint)

A side edge of one roof panel is jointed with a side edge of another roof panel adjacent thereto in the direction perpendicular to the flow of roof by the flashing structure as shown in FIG. 6, which is composed of the joint drip plate 207, the joint cover plate 208, and the keep plate 211.

The joint drip plate 207 is a plate for letting water from the side panels flow onto the lower roof panels, which may be selected from a variety of conventionally known drip plates.

The keep plate 211 is a pedestal for fixing the side panels and for mechanically securing the joint cover 208. The joint cover 208 is a member for preventing the rainwater from intruding into the fastener of keep plate and for maintaining the appearance of the connecting part.

Since the combination solar battery and roof panel according to the present invention is constructed so that the roof panel and the solar battery are electrically insulated from each other by the polymer filler, it does not have to have a special insulating mechanism for insulating the solar batteries adjacent to the joint drip plate and the joint cover plate from each other, the special insulating mechanism being described in Japanese Laid-open Patent Application No. 59-152670, and materials similar to those of the normal joints can be used.

In the present invention, provided are a wire-passing space below the joint drip plate 207 and the opening portion 212 for permitting drawing of wire, thereby achieving the structure capable of measuring the output of each solar battery by removing the joint cover 208 after mounting of roof.

(2-2 Retaining Clip)

The retaining clip 206 is a metal fitting for fixing the roof panel to the base of roof, and a variety of shapes are known conventionally according to the shapes of roof panel. Since the retaining clip is a member for substantially supporting the wind endurance, the thickness thereof is thicker than that of the roof panel and a steel member having sufficient mechanical strength is used in general.

The present embodiment employs the retaining clip having the two claws as shown in FIG. 3, wherein the first claw secures the lower panel while the second claw secures the upper panel.

(2-3 Fastener)

The fastener 214 is a member for mechanically coupling two seam-jointed roof panels with each other, which may be selected from a blind rivet, a screw, a drill screw, and so on. In either case the fastener is easily removable so as to enable to dismount the roof panel after mounted. Since the roof panel of the present invention is the member having such flexural rigidity as to permit the roof panel to be turned up after disconnection of seam joint, the backing used herein is relatively thin. It is, therefore, desirable to increase the strength by coupling the roof panels by the fastener 214 at the seam joint.

(2-4 Roof Bed Material)

The roof bed material 204 may be any material that can present the base for fixing the roofing material, and particularly preferable materials are plates having a heat insulating property; specifically, sheathing roof board of flat wood plate, mortar, cemented excelsior board, plywood, cemented chip, and insulation board.

The roof bed material may have a backing of a heat insulating material of polystyrene foam, polyurethane foam, polyethylene foam, glass wool, rock wool, or the like.

With use of the heat insulating material having the thermal conductivity of not more than 0.2 kcal/m, hr° C., the air is heated between the roof panel 209 and the roof bed material 204; and as a result, in the case of use of the amorphous silicon solar batteries as solar batteries, degradation of performance of the amorphous silicon solar batteries is recovered by the heat. This can improve the performance of the amorphous silicon solar batteries, so that such an arrangement is suitable for the roof bed material.

In addition, the rafters, asphalt roofing, etc. can also be selected from the conventionally known materials.

EXAMPLES

Example 1

Figure 11:
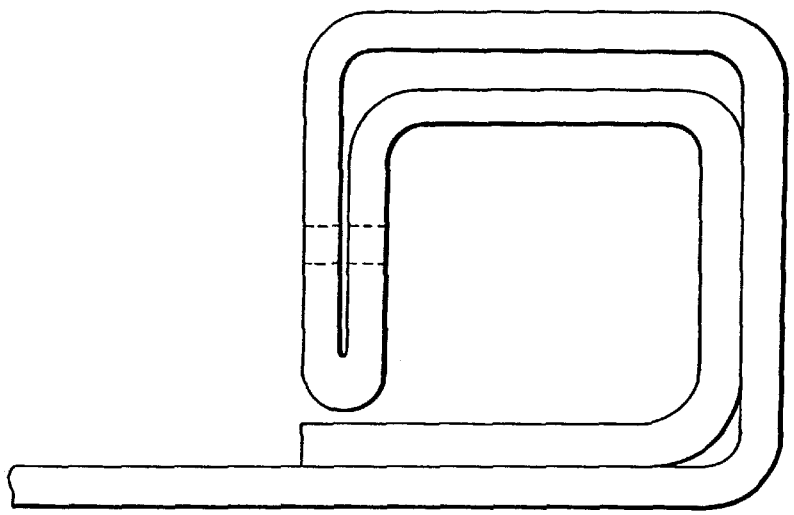
FIG. 11 is a cross-sectional view of a connecting part in the direction of flow of the horizontal-roofing roof in Example 1.

In the above-stated embodiment, the upper-end engaging portion was folded back to the inside as shown in FIG. 11, thereby further enhancing the mechanical strength. The present example has the effect to reinforce coupling between the lower-end engaging portion and the blind rivet 214 and the effect to enhance the mechanical strength of the upper-end engaging portion and thus achieves the effect to enhance the wind endurance. Therefore, the present example is suitable, especially, for cases wherein the backing 204 is made of a material with low mechanical strength, for example, copper, lead, or a zinc alloy.

The roof panel in the present example was made in the working width of 200 mm and the length of 1500 mm and in such a way that the amorphous solar battery film-formed on a stainless steel sheet of 0.125 mm was sealed on a copper sheet of 0.8 mm as the backing by the sealing material 0.9 mm thick. The sealing material had an adhesive layer of EVA and nonwoven glass fabric and an outermost layer of TEFZEL film of 12.5 $\mu$m. The sealing material near the engaging portions had the thickness of 0.45 mm and did not contain the nonwoven glass fabric, taking processability into consideration.

Example 2

Figure 12:
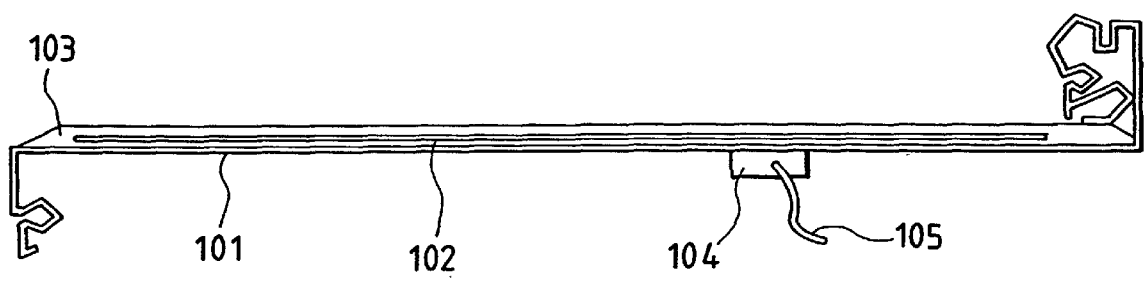
FIG. 12 is a cross-sectional view of the horizontal-roofing roof panel in Example 2.

The horizontal-roofing roof panel in the present example is shown in FIG. 12. Features of the present example are that a steel sheet with very high flexural rigidity is used for the roof backing 101, that the sealing material is not provided near the engaging portions, and that a projected portion and a depressed portion for engagement are provided at the engaging portions.

Figure 13:
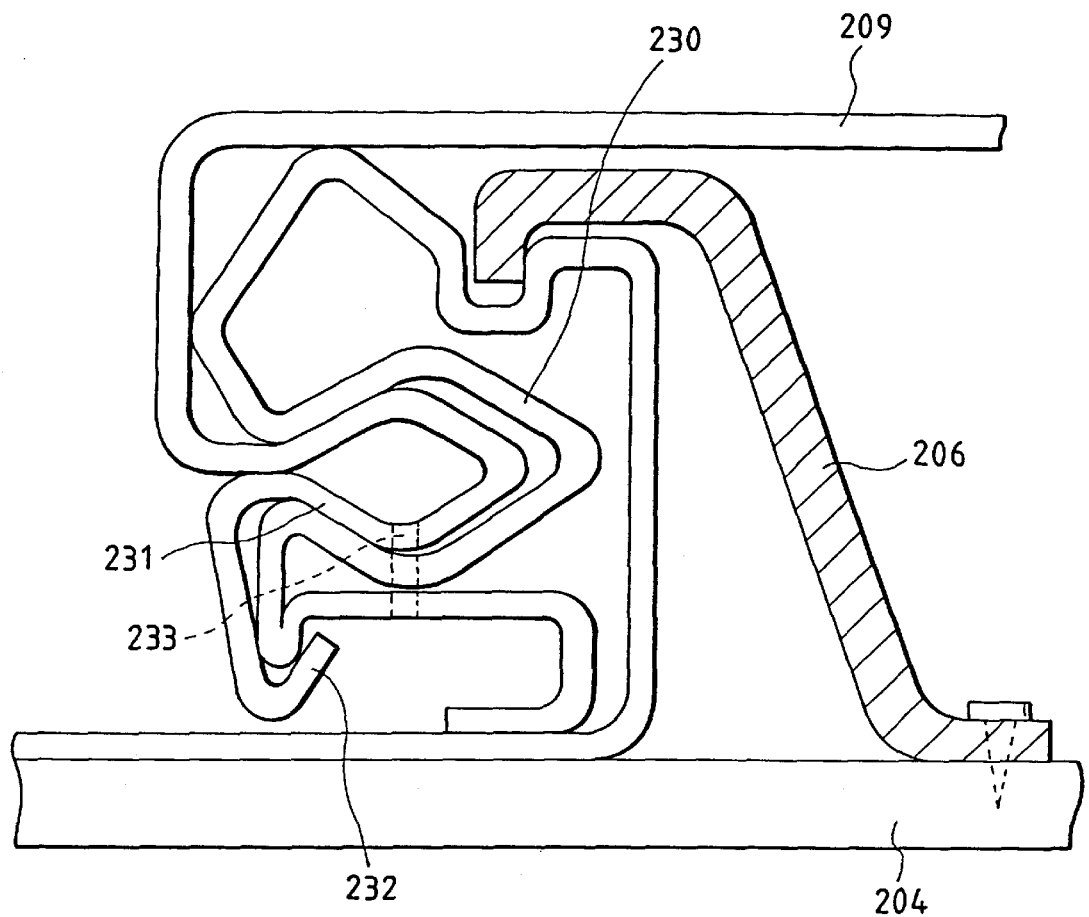
FIG. 13 is a cross-sectional view of a connecting part in the direction of flow of the horizontal-roofing roof in Example 2.

The function will be described with FIG. 13 to show the connected state in the direction of flow of roof. Connection of the upper panel with the lower panel is made by inserting claw 232 into the upper-end engaging portion of the lower panel when mounted and thereafter inserting the projected portion 231 into the depressed portion 230. The projected portion 231, when inserted into the depressed portion, expands inside thereof because of its flexural rigidity and thus has the function to further enhance the mechanical strength.

Since after the mounting the engaging portion is not fixed by a bolt, a blind rivet, or the like, the upper panel can be turned up after the claw 232 is first disengaged by a catching jig such as a screw driver or the like and then the fitting portion is pulled out by making use of the flexural rigidity. Therefore, the present example has an excellent property to further facilitate the maintenance work.

The projected portion 231 looks like a recess when seen from the outside, and the projected portion 231 and depressed portion 230 are perforated in the bottom to have drain hole 233, thus realizing the structure to prevent corrosion of roof panel due to intrusion of rain or the like. In addition, the outer wall of the upper-end engaging portion of the lower panel is structured to strongly contact the lower-end engaging portion of the upper panel as shown in FIG. 13, which constructs the structure very excellent in flashing.

The roof panel in the present example was the horizontal-roofing roof panel made in the working width of 200 mm and the length of 1500 mm and in such a way that the amorphous solar battery film-formed on the stainless steel sheet of 0.125 mm was sealed on a high-flexural-rigidity steel sheet of 0.20 mm as the roof backing by the sealing material 0.9 mm thick. The sealing material had an adhesive layer of EVA and nonwoven glass fabric and an outermost layer of fluororesin film of TEFZEL of 12.5 µm. The sealing material was not used near the engaging portions, for permitting complex processing of the backing and for maintaining the flexural rigidity.

Example 3

Figure 14:
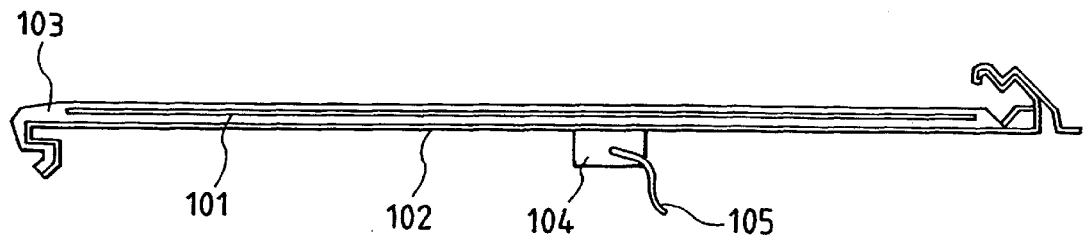
FIG. 14 is a cross-sectional view of the horizontal-roofing roof panel in Example 3.
Figure 15:
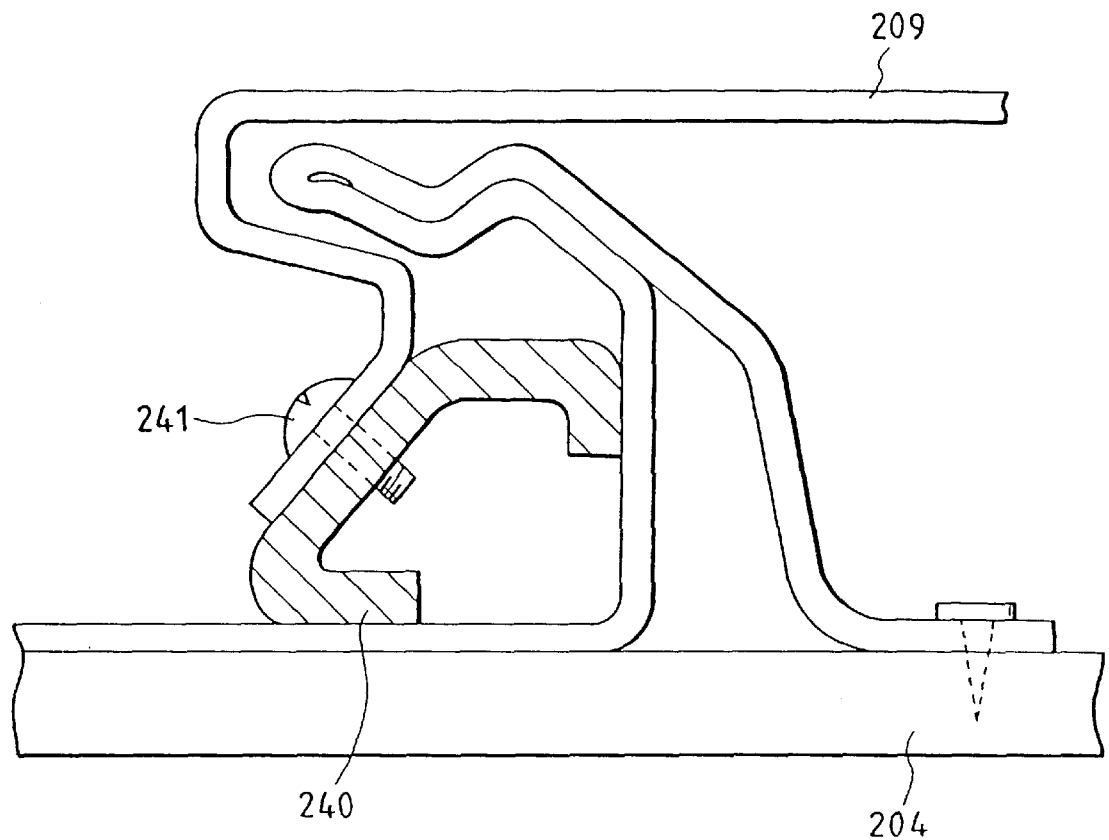
FIG. 15 is a cross-sectional view of a connecting part in the direction of flow of the horizontal-roofing roof in Example 3.

The horizontal-roofing roof panel in this Example 3 is shown in FIG. 14. A feature of the present example is that the engaging portion is bent in the opposite direction to that in Example 1, thereby obviating the need for the retaining clip, and FIG. 15 shows the connected state of the roof panels of the present example in the flow direction of roof.

Numeral 240 denotes a screw receiving member for screwing. This screw receiving member 240 is bonded to the backing by a known method such as welding or a structural adhesive and the roof panel 209 is fixed to the screw receiving member 240 by screw 241.

The present example obviates the need for the retaining clip; and because of no need for the retaining clip, no clearance is formed in the portion without the retaining clip and the lower panel thus folded back can be utilized for enhancing adherence with the upper panel, thus realizing an advantage of strong flashing.

The roof panel in the present example was the horizontal-roofing roof panel made in the working width. of 200 mm and the length of 1500 mm and in such a way that the amorphous solar battery film-formed on the stainless steel sheet of 0.125 mm was sealed on a galvanized iron sheet of 0.25 mm as the roof backing by the sealing material 0.9 mm thick. The sealing material had an adhesive layer of EVA and nonwoven glass fabric and an outermost layer of TEFZEL film of 12.5 µm. The sealing material was not used near the upper-end engaging portion, for permitting complicated processing of the backing and for maintaining the flexural rigidity.

Example 4

Figure 16:
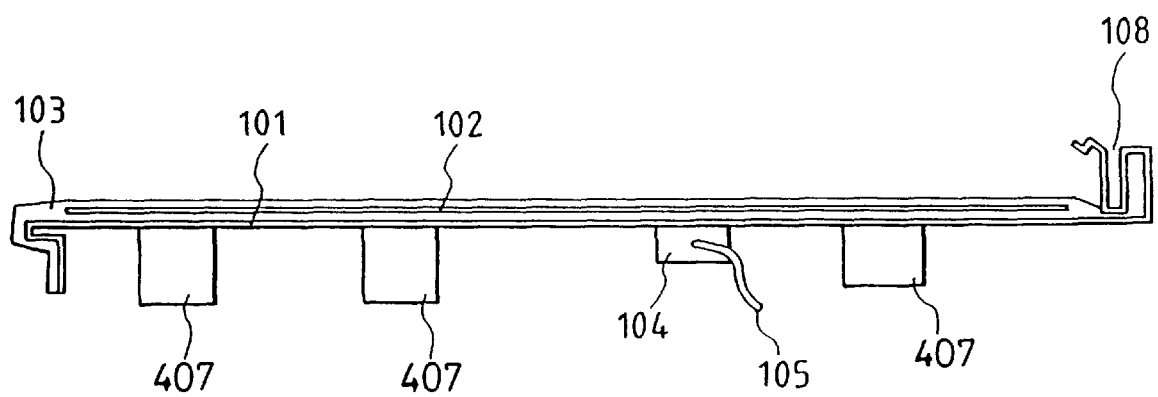
FIG. 16 is a cross-sectional view of the horizontal-roofing roof panel in Example 4.
Figure 17:
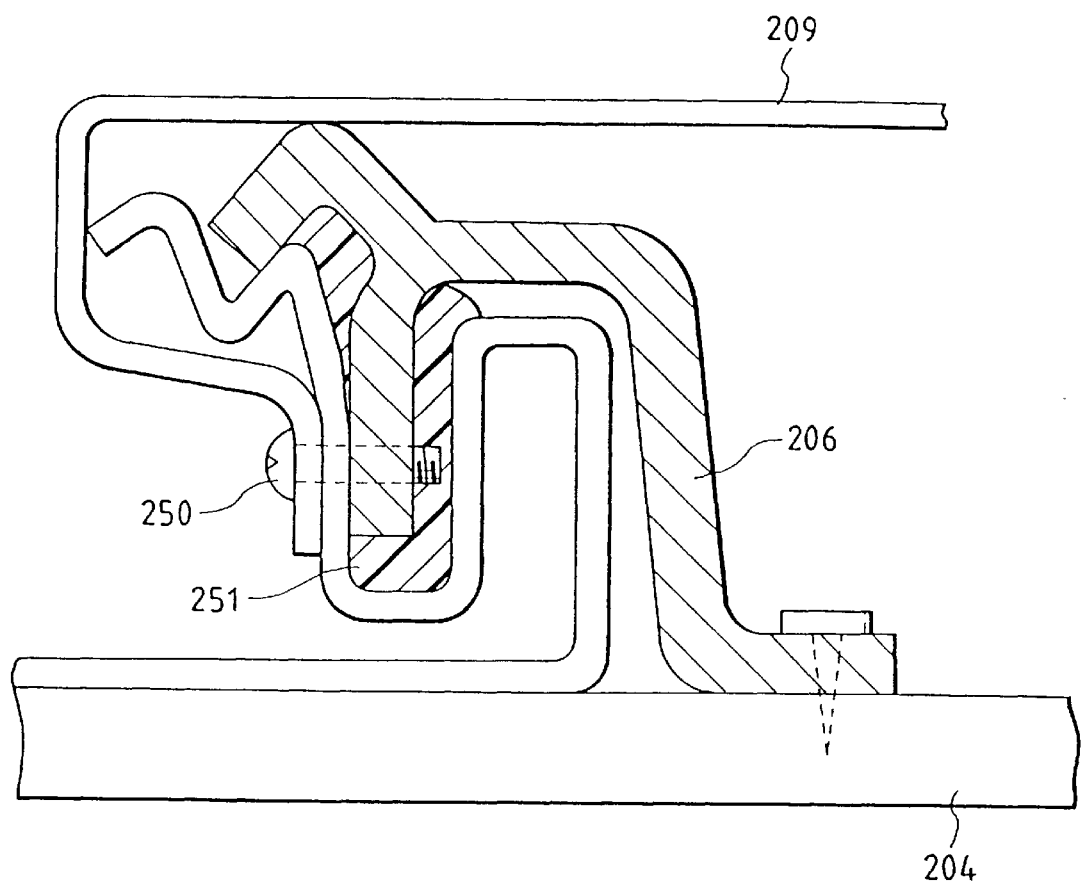
FIG. 17 is a cross-sectional view of a connecting part in the direction of flow of the horizontal-roofing roof in Example 4.

The horizontal-roofing roof panel in this Example 4 is shown in FIG. 16. A feature of the present example is a large recess 108 provided in the upper-end engaging portion, and this recess is used for insertion of retaining clip 206 as shown in FIG. 17. Numeral 251 denotes a sealant, which fills the recess between the retaining clip and the roof panel and which functions to prevent intrusion of rain.

Numeral 250 is a drill screw, which is fixed through the upper panel, the retaining clip, and the lower panel. In the present example, since the upper panel is fixed not only to the lower panel but also to the retaining clip for fixing the lower panel by the fastener, the roof panel has extremely high wind endurance.

Numeral 407 represents buffer members for preventing the combination solar battery and roof panel from being trodden down when stepped on. The buffer members may be selected from the known buffer members of polystyrene foam, polyurethane foam, polyethylene foam, or the like and it is also possible to set beams of wood, plastics, or the like along the longitudinal direction of the horizontal-roofing roof.

The roof panel in the present example was the horizontal-roofing roof panel made in the working width of 275 mm and the length of 1500 mm and in such a way that the amorphous solar battery film-formed on the stainless steel sheet of 0.125 mm was sealed on a galvanized steel sheet of 0.30 mm as the backing by the sealing material 0.9 mm thick. Although the adhesiveness and electric insulation was not essential for the sealant, the sealant used was a silicone sealant effective in suppressing intrusion of rainwater and strong against thermal degradation or the like.

The sealing material had an adhesive layer of EVA and nonwoven glass fabric and an outermost layer of TEFZEL film of 12.5 µm. The sealing material was not used near the upper-end engaging portion, for permitting complicated processing of the backing.

Example 5

Figure 18:
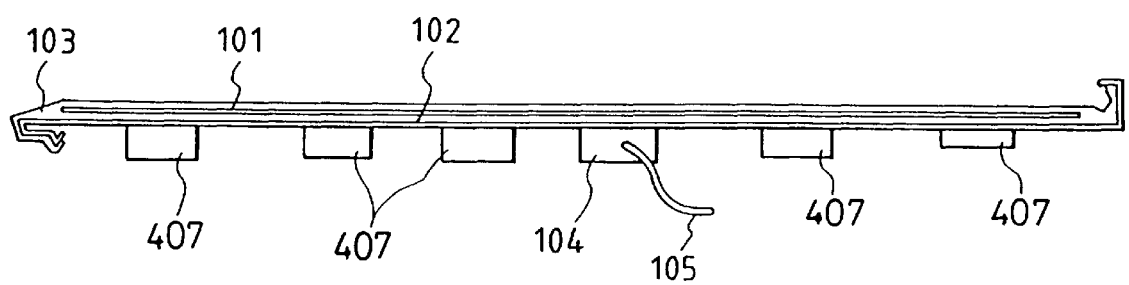
FIG. 18 is a cross-sectional view of the horizontal-roofing roof panel in Example 5.
Figure 19:
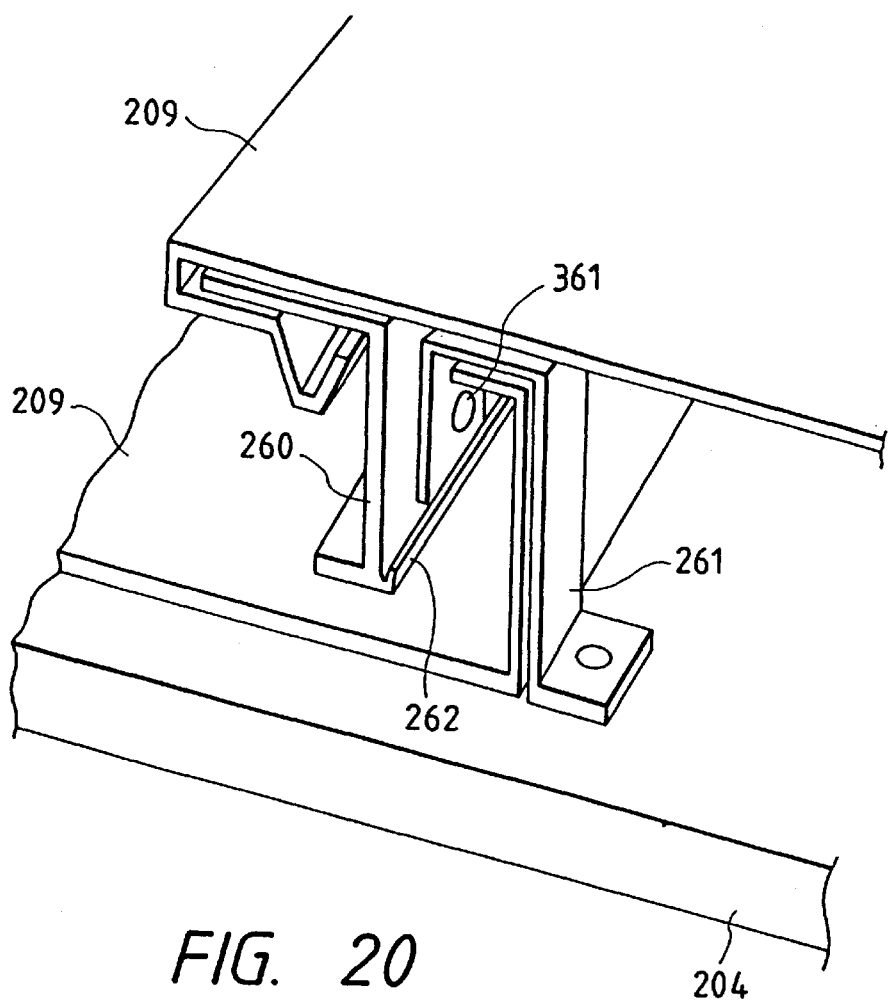
FIG. 19 is a perspective view of a connecting part in Example 5.

The horizontal-roofing roof panel in this Example 5 is shown in FIG. 18. A feature of the present example is that the retaining clip is composed of two constituent members 260 and 261, thus having such structure that, as shown in FIG. 19, the member 260 is engaged with the upper roof panel and functions as flashing and the member 261 is fixed to the sheathing roof board.

Describing in further detail, the member 260 has the same width as the roof panel and numeral 361 designates a blind rivet for joining the two members. Since a hole for this rivet has a little play, force of wind to lift the roof 209 is transmitted from the member 260 directly to the member 261 through claw 262. Therefore, as to the wind endurance, the force is received as scattered linearly, which achieves the function capable of greatly enhancing the wind endurance.

Since the present example obviates the need for fixing the roof panel by directly perforating the roof panel as in the examples described above, the present example has a great margin for absorbing thermal expansion and contraction specific to the metal roof and facilitates enlargement of one roof panel in the flow direction (in the direction of from the ridge to the eaves). In addition, the present example has a special, functional effect to greatly improve the resistance against metal fatigue or the like.

Numeral 407 represents buffer members for preventing the roof panel from being trodden down when the combination solar battery and roof panel is stepped on after mounted. The buffer members are placed in parallel with the longitudinal direction of the roof panel. Owing to this, the buffer members are not a hindrance while the roof panel is turned up. The buffer members may be any known buffer members of polystyrene foam, polyurethane foam, polyethylene foam, or the like and it is also possible to set beams of wood, plastics, or the like along the longitudinal direction of the horizontal-roofing roof.

The roof panel in the present example was the the horizontal-roofing roof panel made in the working width of 275 mm and the length of 1500 mm and in such a way that the amorphous solar battery film-formed on the stainless steel sheet of 0.125 mm was sealed on a galvanized steel sheet of 0.30 mm as the backing by the sealing material 0.9 mm thick. The sealing material had an adhesive layer of EVA and nonwoven glass fabric and an outermost layer of TEFZEL film of 12.5 µm. Near the engaging portions, the nonwoven glass fabric was excluded for permitting complicated processing of the backing and the thickness of the sealing material was set to be 0.45 mm thinner.

What is claimed is:

1. A roof mounting method comprising the steps of:

mounting two adjacent combination solar battery and roof panels on a joint drip plate having an opening portion;

electrically connecting the two adjacent combination solar battery and roof panels in the opening portion; and placing a keep plate and a joint cover on the joint drip plate and roof panels.

2. A roof mounting method according to claim 1, further comprising the step of providing each combination solar battery and roof panel with a junction box for drawing power out of a solar battery element fixed on the combination solar battery and roof panel.

3. A roof mounting method according to claim 2, further comprising the step of providing a collector electrode on the solar battery element, with a longitudinal direction of the collector electrode being parallel to a longitudinal direction of the roof panel.

4. A roof mounting method according to claim 2, further comprising the step of providing a buffer member higher than the junction box on a back surface of the roof panel.

5. A roof mounting method according to claim 2, further comprising the step of providing the solar battery element with a non-monocrystal semiconductor.

* * * * *

UNITED STATES PATENT AND TRADEMARK OFFICE
CERTIFICATE OF CORRECTION

PATENT NO.   : 6,336,304 B1
DATED        : January 8, 2002
INVENTOR(S)  : Toshihiko Mimura et al.

It is certified that error appears in the above-identified patent and that said Letters Patent is hereby corrected as shown below:

Title page,
Item [56], References Cited, FOREIGN PATENT DOCUMENTS, "896611" should read -- 596611 --.

Column 2,
Line 4, "a a" should read -- a --.
Line 30, "joint" should read -- the joints --.
Line 41, "joint" should read -- the joint --.

Column 4,
Line 66, "upper-end." should read -- upper-end --.

Column 7,
Line 15, "kgcm$^2$." should read -- kg/cm$^2$. --.

Column 8,
Line 15, "texturized-where" should read -- texturized where --.

Column 9,
Lines 53 and 54, "dupont)," should read -- du Pont), --.

Column 10,
Line 16, "PP0" should read -- PPO --.

Column 11,
Line 64, "kcal/m, hr °C." should read -- kcal m$^{-1}$ hr$^{-1}$ °C$^{-1}$ --.

UNITED STATES PATENT AND TRADEMARK OFFICE
CERTIFICATE OF CORRECTION

PATENT NO. : 6,336,304 B1
DATED : January 8, 2002
INVENTOR(S) : Toshihiko Mimura et al.

It is certified that error appears in the above-identified patent and that said Letters Patent is hereby corrected as shown below:

Column 13,
Line 33, "width." should read -- width --.

Signed and Sealed this

Eighth Day of October, 2002

Attest:

JAMES E. ROGAN
Attesting Officer
Director of the United States Patent and Trademark Office